United States Patent
Jung et al.

(10) Patent No.: US 7,531,459 B2
(45) Date of Patent: May 12, 2009

(54) METHODS OF FORMING SELF-ALIGNED SILICIDE LAYERS USING MULTIPLE THERMAL PROCESSES

(75) Inventors: Sug-woo Jung, Gyeonggi-do (KR); Gil-heyun Choi, Gyeonggi-do (KR); Byung-hee Kim, Seoul (KR); Jong-ho Yun, Gyeonggi-do (KR); Hyun-su Kim, Gyeonggi-do (KR); Eun-ji Jung, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 274 days.

(21) Appl. No.: 11/452,042

(22) Filed: Jun. 13, 2006

(65) Prior Publication Data

US 2006/0281305 A1 Dec. 14, 2006

(30) Foreign Application Priority Data

Jun. 13, 2005 (KR) .................. 10-2005-0050528

(51) Int. Cl.
 *H01L 21/44* (2006.01)
(52) U.S. Cl. ............... 438/682; 438/308; 438/655; 438/664; 257/E21.165; 257/E21.199
(58) Field of Classification Search .......... 438/630, 438/580, 581, 582, 583, 651, 721, 755; 257/E21.164, 257/E21.439
See application file for complete search history.

(56) References Cited

U.S. PATENT DOCUMENTS

| | | | | |
|---|---|---|---|---|
| 6,121,100 | A * | 9/2000 | Andideh et al. | 438/305 |
| 6,251,780 | B1 * | 6/2001 | Sohn et al. | 438/683 |
| 6,627,527 | B1 * | 9/2003 | Wang et al. | 438/592 |
| 2003/0073277 | A1 * | 4/2003 | Cho et al. | 438/211 |

FOREIGN PATENT DOCUMENTS

| | | |
|---|---|---|
| JP | 2003-282592 | 10/2003 |
| KR | 1020040003903 | 1/2004 |
| KR | 1020040061614 | 7/2004 |

* cited by examiner

*Primary Examiner*—Walter L Lindsay, Jr.
*Assistant Examiner*—Cheung Lee
(74) *Attorney, Agent, or Firm*—Myers Bigel Sibley & Sajovec, P.A.

(57) ABSTRACT

Methods of forming a metal salicide layer can include forming a metal layer on a substrate and forming a metal silicide layer on the metal layer using a first thermal process at a first temperature. Then a second process is performed, in-situ with the first thermal process, on the metal layer at a second temperature that is less than the first temperature.

22 Claims, 12 Drawing Sheets

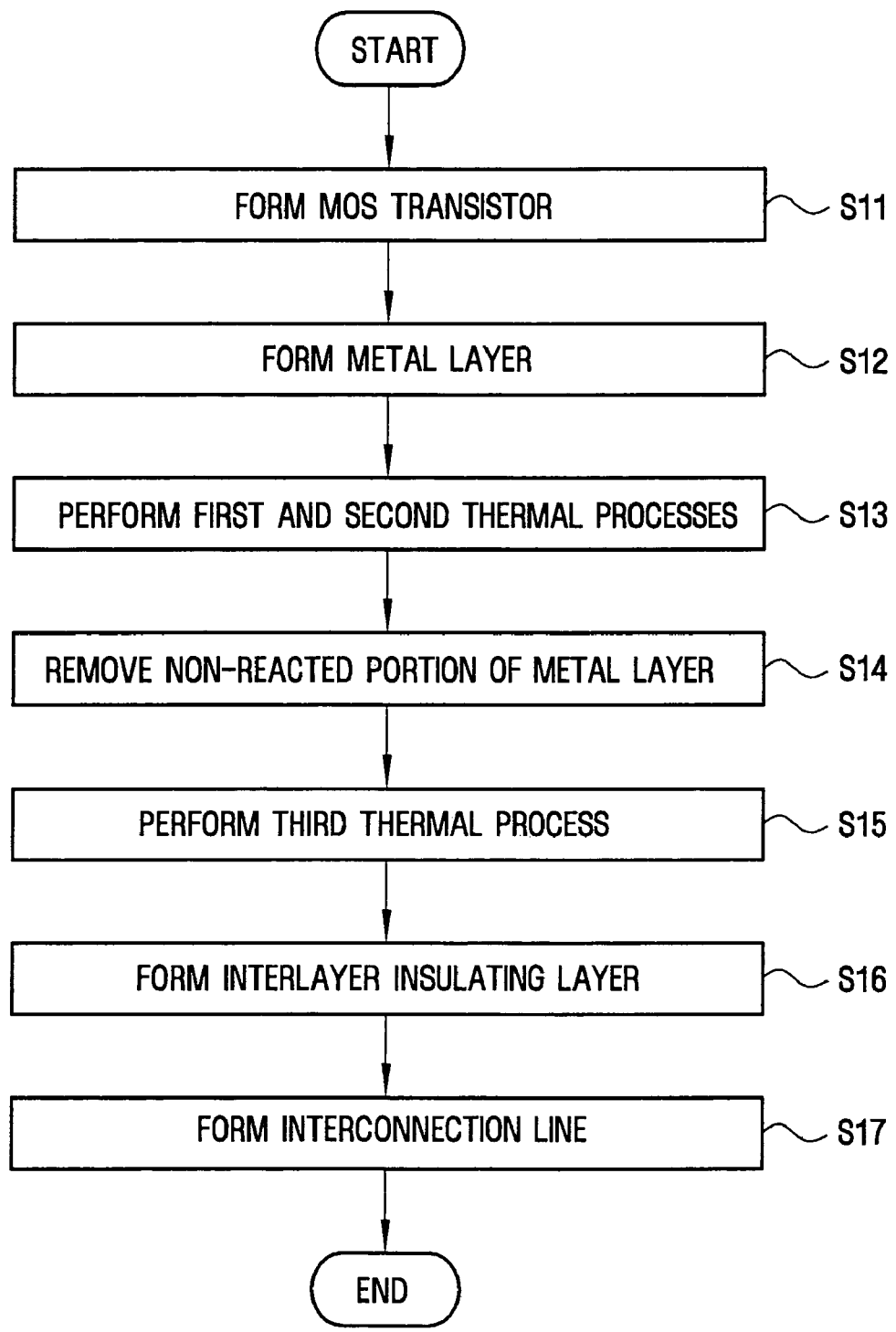

METHODS OF FORMING SELF-ALIGNED SILICIDE LAYERS USING MULTIPLE THERMAL PROCESSES

This application claims priority from Korean Patent Application No. 10-2005-0050528 filed on Jun. 13, 2005, in the Korean Intellectual Property Office, the disclosure of which is incorporated herein by reference in its entirety.

FIELD OF THE INVENTION

The present invention relates to methods of fabricating semiconductor devices, and more particularly, to methods of forming self-aligned silicide layers.

BACKGROUND

Semiconductor devices generally use discrete devices such as metal oxide semiconductor (MOS) transistors as switching devices. As a semiconductor device becomes highly integrated, a MOS transistor may be scaled down. Thus, the channel length of the MOS transistor may decrease, resulting in a short channel effect. The decrease in the channel length may lead to a decrease in the width of a gate electrode, causing an increase in the electrical resistance of the gate electrode. To address the short channel effect problem, the junction depth of source/drain regions of the MOS transistor and the thickness of a gate insulating layer may both be reduced. As a result, the resistance (R) and the gate capacitance (C) of the gate electrode can increase. In this case, the transmission speed of an electric signal applied to the gate electrode may be delayed by a resistance-capacitance (RC) delay time.

In addition, since the source/drain regions have a shallow junction depth, their sheet resistance may increase. As a result, drivability of a single-channel MOS transistor may be reduced. For a high-performance MOS transistor suitable for a highly-integrated semiconductor device, a salicide (self-aligned silicide) process is widely used.

The salicide process is a processing technique for reducing the electrical resistance of a gate electrode and source/drain regions by selectively forming a metal silicide layer on the gate electrode and the source/drain regions. Recently, a salicide process in which a nickel silicide layer is formed using nickel has been used for manufacturing a high-performance MOS transistor. The nickel silicide layer can be formed at low temperature, its resistance does not increase with line narrowing, and a small amount of silicon is consumed.

SUMMARY

Embodiments according to the invention can provide methods of forming self-aligned silicide layers using multiple thermal processes. Pursuant to these embodiments, a metal salicide layer can be formed by forming a metal layer on a substrate and forming a metal silicide layer on the metal layer using a first thermal process at a first temperature. Then a second process is performed, in-situ with the first thermal process, on the metal layer at a second temperature that is less than the first temperature, as the nickel silicide layer may have low stability when processed at high temperatures In some embodiments according to the invention, a method of fabricating a semiconductor device can include forming a metal oxide semiconductor (MOS) transistor including source/drain regions separated from each other in a substrate, a gate pattern on a channel region in the substrate between the source/drain regions, and a spacer covering the sidewalls of the gate pattern. A metal layer is formed on the entire surface of the MOS transistor and a metal silicide layer is formed on the metal layer using a first thermal process at a first temperature. Then a second thermal process is performed on the metal layer, in-situ with the first thermal process, at a second temperature that is less than the first temperature.

In some embodiments according to the invention, a method of fabricating a semiconductor device can include performing a silicidation anneal process on a nickel layer on a source/drain region at a first temperature of about 300° C. to about 400° C. and then forming a $Ni_2Si$ layer from the nickel layer using a thermal process to react an the nickel layer with silicon in the source/drain region, in-situ with the silicidaiton anneal process, at second of about 200-300° C. for about 10 to about 30 minutes. The $Ni_2Si$ layer can be phase-shifted using a thermal process at a temperature of about 400- to about 500° C. to form a NiSi layer.

In some embodiments according to the invention, each of the performing a silicidation anneal process, forming a $Ni_2Si$ layer, and phase-shifting the $Ni_2Si$ is ceased before initiating a subsequent process.

BRIEF DESCRIPTION OF THE DRAWINGS

FIG. 1 is a flowchart illustrating embodiments of a salicide process according to the invention

DESCRIPTION OF EMBODIMENTS ACCORDING TO THE INVENTION

Figure 2A:
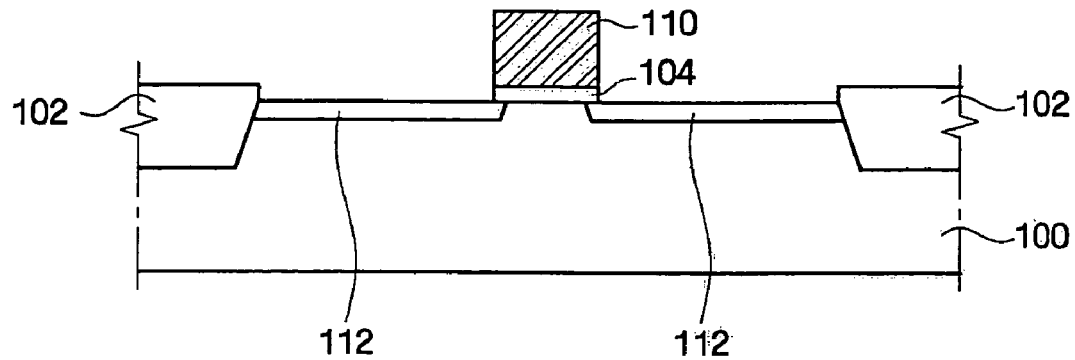
FIGS. 2A through 7 are cross-sectional views that illustrate a salicide process according to some embodiments of the invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper"and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described hereinafter with reference to flowchart illustrations of method of a salicide process and a method of fabricating a semiconductor device using the salicide process according to embodiments of the invention. FIG. 1 is a flowchart for explaining a salicide process and a method of fabricating a semiconductor device using the salicide process according to a first embodiment of the present invention. And also FIGS. 2A through 7 are cross-sectional views for explaining a salicide process and methods of fabricating a semiconductor device using the salicide process according to the first embodiment of the present invention.

Referring to FIG. 1, a MOS transistor is formed on a semiconductor substrate in S11.

Referring to FIG. 2A, an active region is defined by forming a device isolation film 102 in a predetermined region of a semiconductor substrate 100. The semiconductor substrate 100 may be a silicon substrate or a silicon on insulator (SOI) substrate. A gate insulating layer is formed on the active region. A gate conductive layer is formed on the entire surface of the semiconductor substrate 100 having the gate insulating layer. The gate conductive layer may be formed of a silicon layer such as a polysilicon layer. The silicon layer may be doped with n-type impurities or p-type impurities. On the other hand, the gate conductive layer may be formed by sequentially depositing a silicon layer and a tungsten-silicide layer.

A gate pattern 110 traversing the active region is formed by patterning the gate conductive layer. As a result, the gate pattern 110 includes a gate electrode. In some embodiments according to the invention, the gate conductive layer is formed of only a silicon layer and the gate electrode is formed of only a silicon layer pattern. In some embodiments according to the invention, the gate conductive layer is formed by sequentially depositing a polysilicon layer and a tungsten-silicide layer or a polysilicon layer and a tungsten layer and, further, a gate electrode 106 includes a polysilicon layer pattern and a tungsten-silicide layer pattern or a polysilicon layer pattern and a tungsten layer pattern that are sequentially deposited.

The gate insulating layer may be patterned during a process of forming the gate pattern 110. As a result, as shown in FIG. 2A, a gate insulating layer pattern 104 is formed between the gate pattern 110 and the active region. Lightly doped drain (LDD) regions 112 are formed by implanting first impurity ions into the active region using the gate pattern 110 and the device isolation layer 102 as ion implantation masks. The first impurity ions may be n-type impurity ions or p-type impurity ions.

Figure 2B:
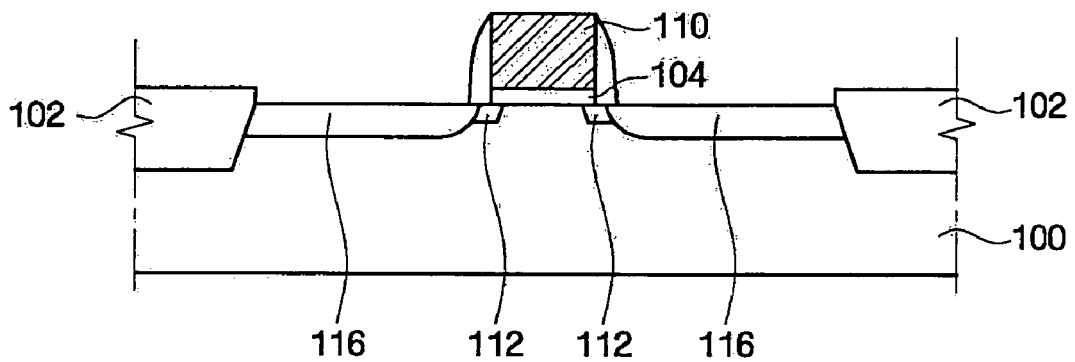

Referring to FIG. 2B, a spacer insulating layer is formed on the entire surface of the semiconductor substrate 100 having the LDD regions 112. The spacer insulating layer may be formed of, e.g., a silicon nitride layer. A spacer 114 is formed on the sidewalls of the gate pattern 110 by anisotropically etching the spacer insulating layer. Source/drain regions 116 are formed by implanting second impurity ions in the active region using the gate pattern 110, the spacer 114, and the device isolation layer 102 as ion implantation masks. As a result, the LDD regions 112 remain under the spacer 114. The second impurity ions may be n-type impurity ions or p-type impurity ions and have the same conductive type as the impurity ions implanted in the active region. The gate pattern 110, the gate insulating layer 104, the source/drain regions 116, and the spacer 114 constitute a MOS transistor wherein the source/drain regions 116 can be thermally processed to activate impurity ions therein.

Next, a metal layer is formed on the semiconductor substrate 100 having the MOS transistor (S12 of FIG. 1).

Figure 3:
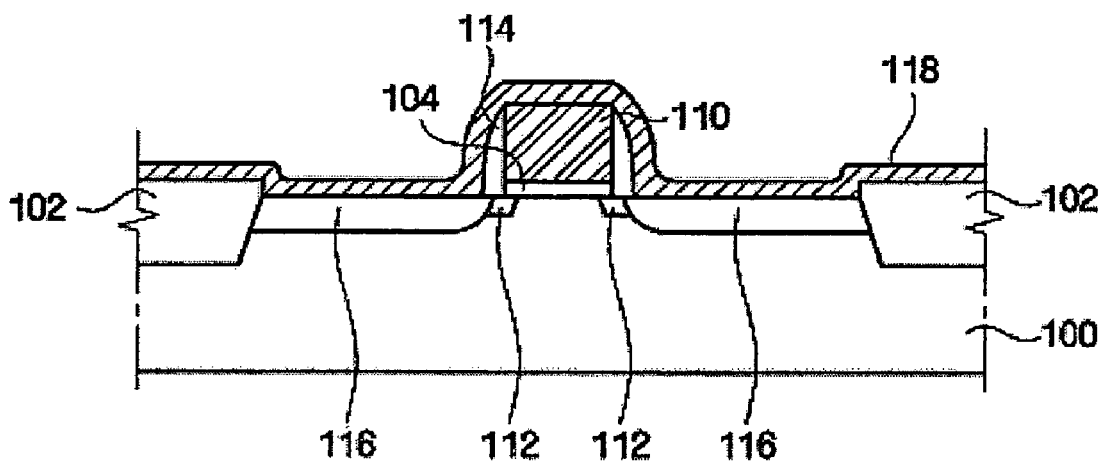

Referring to FIG. 3, a native oxide layer and contaminated particles remaining on the source/drain regions 116 are removed by washing the surface of the semiconductor substrate 100 in which the source/drain regions 116 are thermally processed. A metal layer 118 is formed on the entire surface of the washed semiconductor substrate 116. The metal layer 118 may be formed of, for example, nickel.

Next, first and second thermal processes are performed on the metal layer 118 (S13 of FIG. 1).

Figure 4:
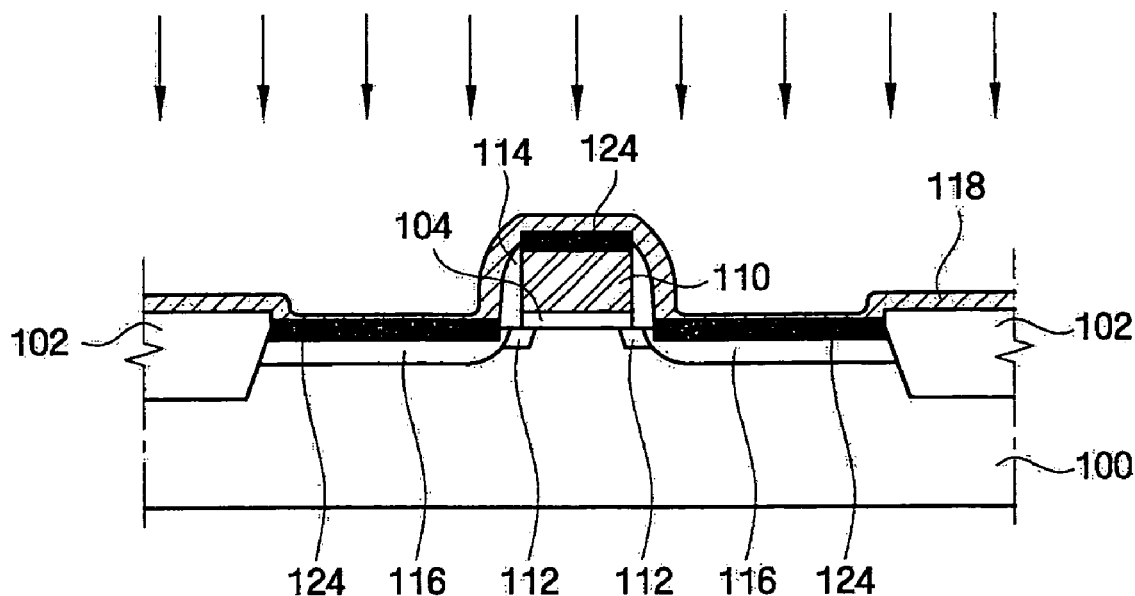

Referring to FIG. 4, a silicidation annealing process is performed on the metal layer 118 formed on the semiconductor substrate 100. More specifically, a silicidation annealing process is performed to form a metal silicide layer by performing a first thermal process on the metal layer 118 formed on the semiconductor substrate 100 and a second thermal process on the metal layer 118 in an in-situ manner. The first thermal process may be performed at a temperature of about 300 to about 600° C. In some embodiments according to the invention, the first temperature is about 300 to about 400° C.

In some embodiments according to the invention, the second thermal process may be performed at a temperature that is less than that of the first thermal process. In some embodiments according to the invention, the second temperature is about 200 to about 300° C. In some embodiments according to the invention, the second thermal process is performed for about 10 minutes or more. In some embodiments according to the invention, the second thermal process is performed for about 10 to about 30 minutes. In this case, the metal layer 118 on the source/drain regions 116, e.g., a nickel layer, is reacted with silicon atoms in the source/drain regions 116 to form dinickel monosilicide ($Ni_2Si$) or nickel monosilicide (NiSi).

The first and second annealing steps may be performed using conduction and/or convection. Annealing techniques using conduction or convection are more fully described in, for example, Korean Patent Application No. 2004-0062632, assigned to the present assignee, the disclosure of which is hereby incorporated herein by reference as if fully set forth herein.

Next, a portion of the metal layer 118 that is not reacted with the silicon atoms is removed (S14 of FIG. 1).

Figure 5:
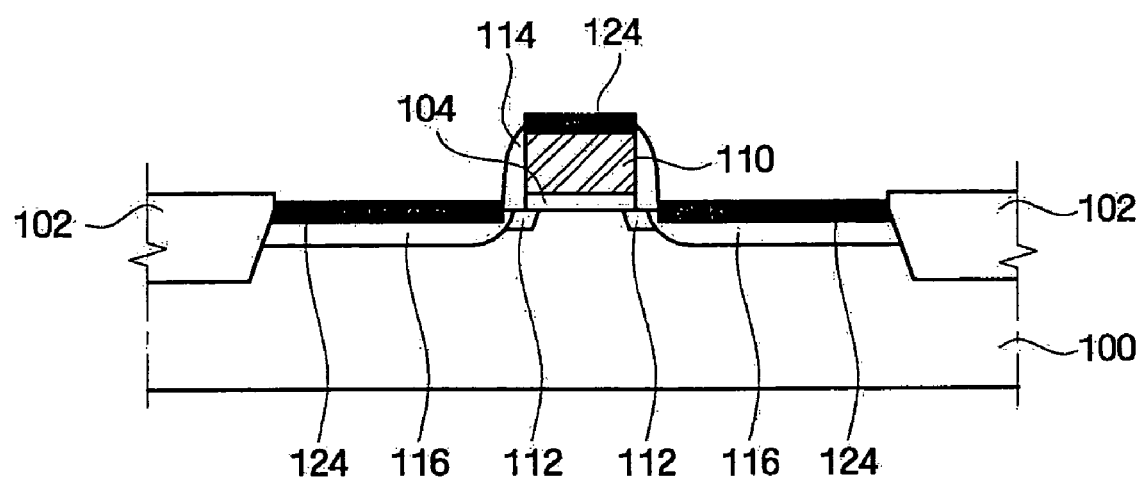

Referring to FIG. 5, the spacer 114 and the non-reacted portion of the metal layer 118 on the device isolation layer 102 are removed. The non-reacted portion of the metal layer 118 may be removed using, e.g., a mixture of sulfuric acid ($H_2SO_4$) and hydrogen peroxide ($H_2O_2$).

Next, a third thermal process is performed on a metal silicide layer (S15 of FIG. 1).

Figure 6:
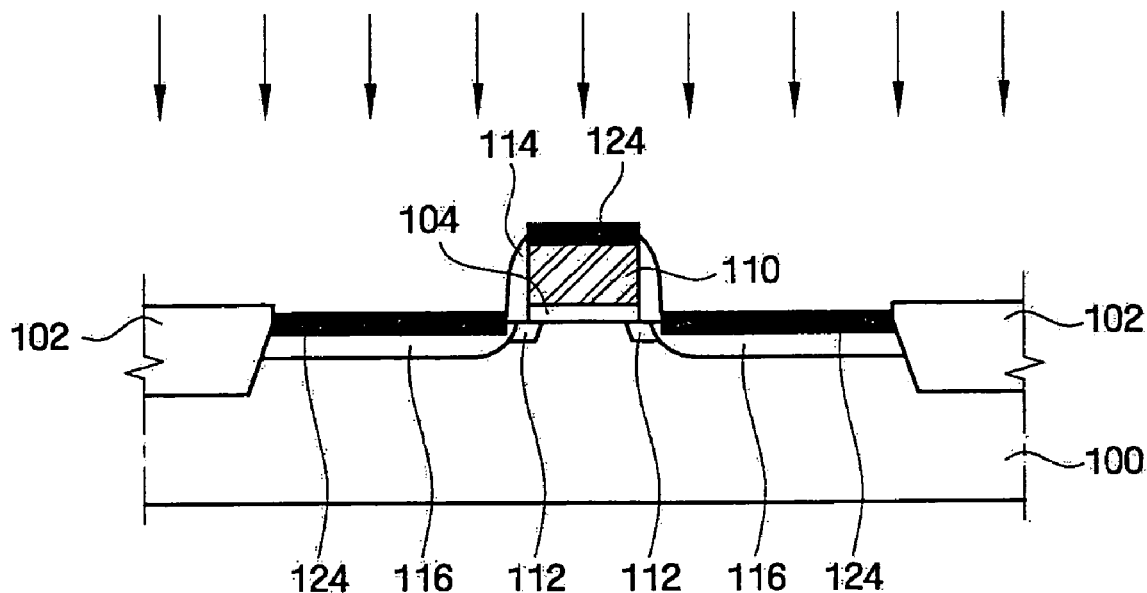

Referring to FIG. 6, the third thermal process is performed on the semiconductor substrate 100 from which the non-reacted portion of the metal layer 118 is removed. The third thermal process is performed at a temperature of 300-600° C., e.g., 400-500° C. In this case, dinickel monosilicide ($Ni_2Si$) formed by performing the first and second thermal processes on the metal layer, e.g., a nickel layer, is phase-shifted into nickel monosilicide (NiSi) having low resistivity, and thus nickel silicide (NiSi) layers 124 are formed of nickel monosilicide (NiSi) having low resistivity. The third thermal process may be skipped. In addition, the third thermal process may use conduction or convection like the first and second thermal processes.

When the gate pattern 110 is formed of only the gate electrode 106 and the gate electrode 106 is formed of only a silicon layer pattern, e.g., a polysilicon layer pattern, the metal silicide layers 124 are selectively formed only on the source/drain regions 116 and the gate electrode 106.

Figure 7:
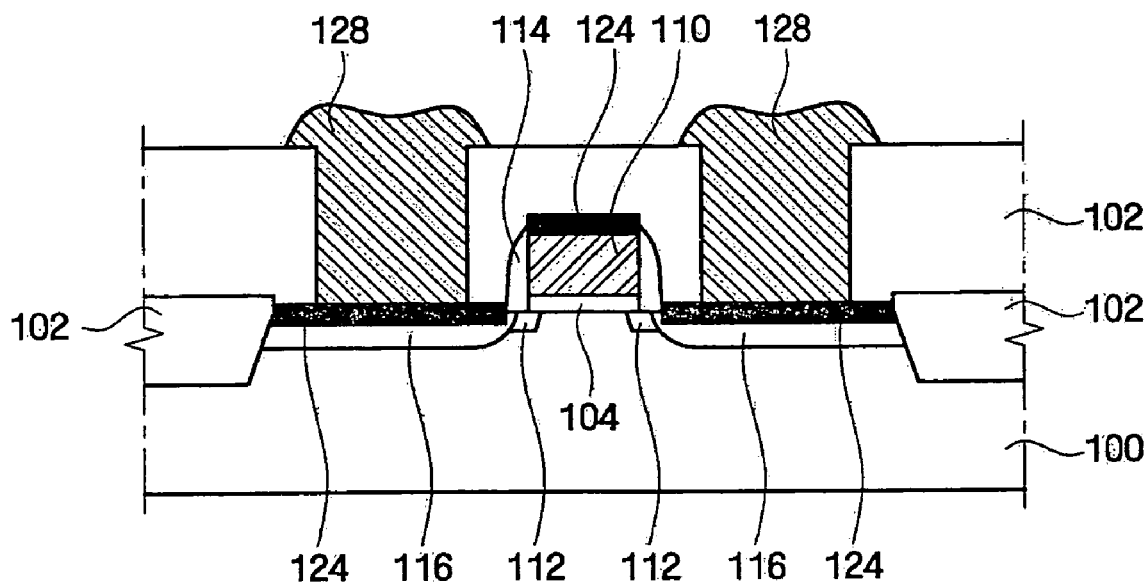

Next, referring to FIG. 7, an interlayer insulating layer 126 is formed on the entire surface of the semiconductor substrate 100 having the metal silicide layers 124 (S16 of FIG. 1). Contact holes that expose the metal silicide layers 124 on the source/drain regions 116 are formed by patterning the interlayer insulating layer 126. A metal layer is formed on the entire surface of the semiconductor substrate 100 having the contact holes and metal interconnection lines 128 that fill the contact holes are formed by patterning the formed metal layer (S17 of FIG. 1).

In a salicide process and a method of fabricating a semiconductor device using the same according to an embodiment of the present invention, when a nickel silicide layer is formed using a nickel layer, a defect can be reduced of prevented from being generated in the nickel silicide layer. When a nickel silicide layer is formed using a conventional method, the nickel silicide layer may have defects on its surface due to its weak thermal stability and thus has rough surface morphology. When a nickel silicide layer is applied to a semiconductor device such as a MOS transistor, its rough surface morphology can lead to poor interfacial characteristics between a silicon substrate and a silicide layer. As a result, the defects on the surface of the nickel silicide layer may increase the sheet resistance and contact resistance of the nickel silicide layer and degrade the electrical characteristics of the MOS transistor such as a junction leakage in a junction interface.

The defects on the surface of the nickel silicide layer are affected by the temperature and time of silicidation annealing. The defects on the surface of the nickel silicide layer are also affected by impurity ions and are particularly generated when the nickel silicide layer is formed on a silicon substrate in which n-type impurity ions are doped. Thus, in a salicide process and a method of fabricating a semiconductor device using the same according to an embodiment of the present invention, to form a nickel layer with a nickel silicide layer, after the first thermal process is performed, the second thermal process is performed in an in-situ manner at temperature that is lower than that of the first thermal process and the third thermal process is performed, thereby preventing defects from being generated in the nickel silicide layer.

Hereinafter, a method of fabricating a semiconductor device according to a second embodiment of the present invention will be described with reference to FIGS. 8 through 13. The second embodiment of the present invention is different from the first embodiment of the present invention in that a gate capping layer pattern is further formed on the gate electrode and a capping layer is further formed on the metal layer. Thus, repetition will be avoided for convenience of explanation.

Figure 8:
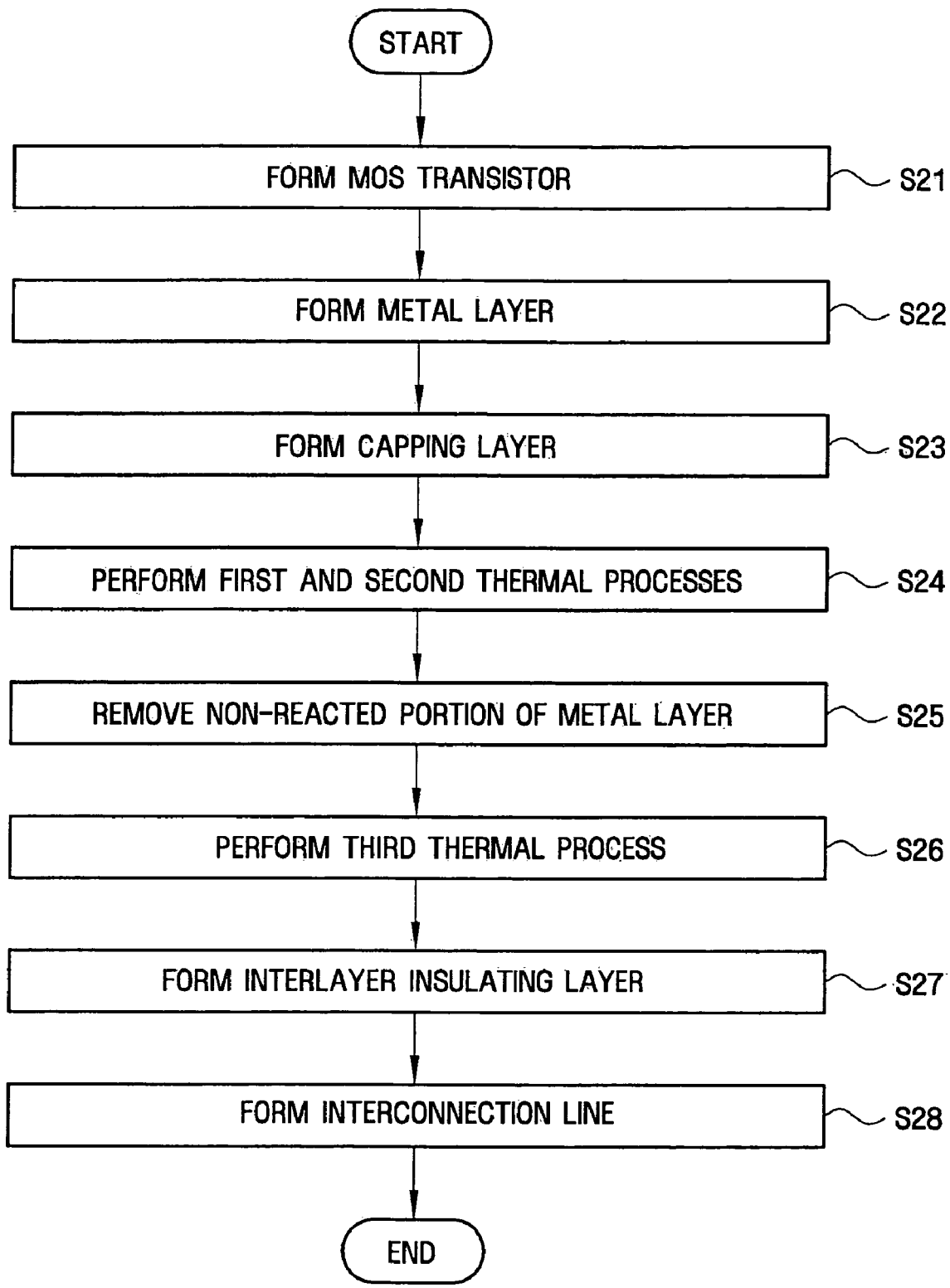
FIG. 8 is a flowchart illustrating embodiments of a salicide process according to the invention.

Referring to FIG. 8, a MOS transistor is formed on a semiconductor substrate in S21.

Figure 9A:
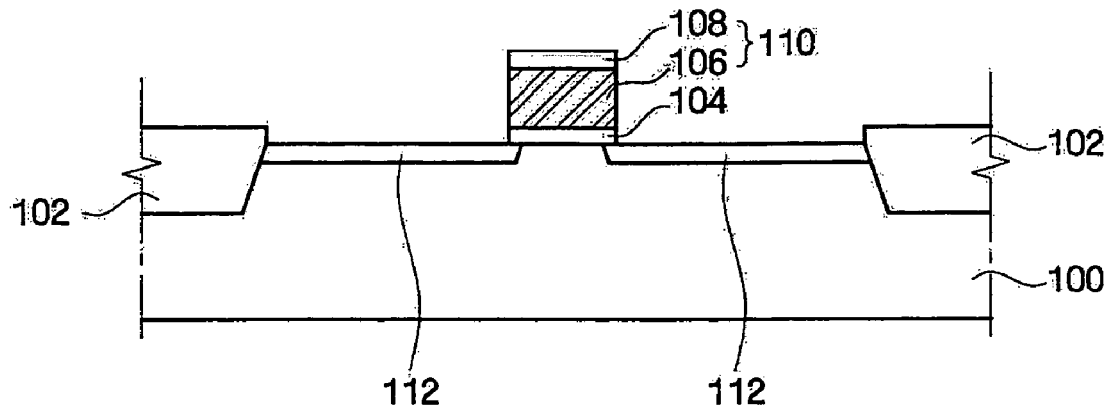
FIGS. 9A through 13 are cross-sectional views that illustrate a salicide process according to some embodiments of the invention.

Referring to FIG. 9A, an active region is defined by forming a device isolation layer 102 in a predetermined region of a semiconductor substrate 100. A gate insulating layer is formed in the active region. A gate conductive layer and a gate capping layer are sequentially formed on the entire surface of the semiconductor substrate 100 having the gate insulating layer. The gate capping layer is formed of an insulating layer such as a silicon oxide layer or a silicon nitride layer.

Next, a gate pattern 110 traversing the active region is formed by patterning the gate capping layer and the gate conductive layer. As a result, the gate pattern 110 includes a gate electrode 106 and a gate capping layer pattern 108 that are sequentially deposited. A gate insulating layer pattern 104 is formed between the gate pattern 110 and the device isolation layer 102 by patterning the gate insulating layer when the gate pattern 110 is formed. Next, LDD regions 112 are formed by implanting first impurity ions in the active region using the gate pattern 110 and the device isolation layer 102 as ion implantation masks.

Figure 9B:
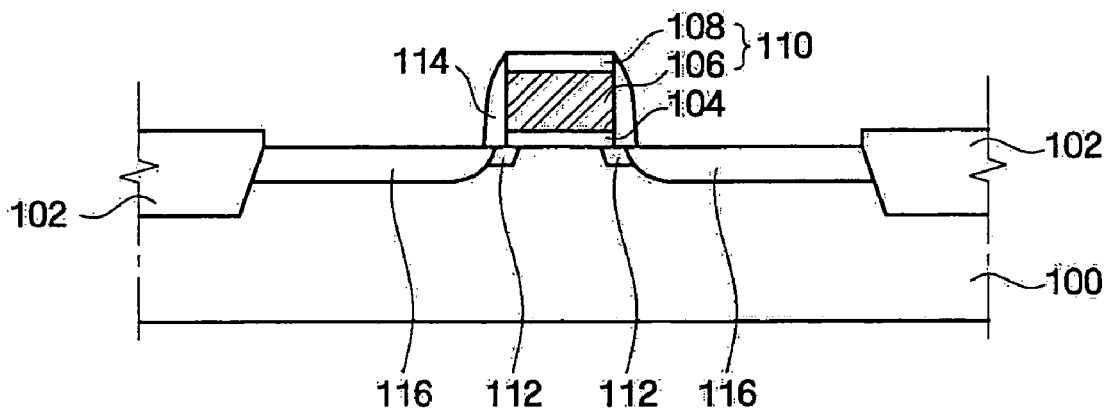

Referring to FIG. 9B, a spacer insulating layer is formed of a silicon nitride layer on the entire surface of the semiconductor substrate 100 having the LDD regions 112. The spacer insulating layer is anisotropically etched, thereby forming a spacer 114 in the sidewalls of the gate pattern 110. Source/drain regions 116 are formed by implanting second impurity ions in the active region using the gate pattern 110, the spacer 114, and the device isolation layer 102 as ion implantation masks. The source/drain regions 116 are thermally processed, thereby activating impurity ions of the source/drain regions 116.

The gate pattern 110 including the gate electrode 106 and the gate capping layer pattern 108, the gate insulating layer 104, the source/drain regions 116, and the spacer 114 constitute a MOS transistor.

Next, a metal layer is formed on the semiconductor substrate 100 having the MOS transistor (S22 of FIG. 8).

Figure 10:
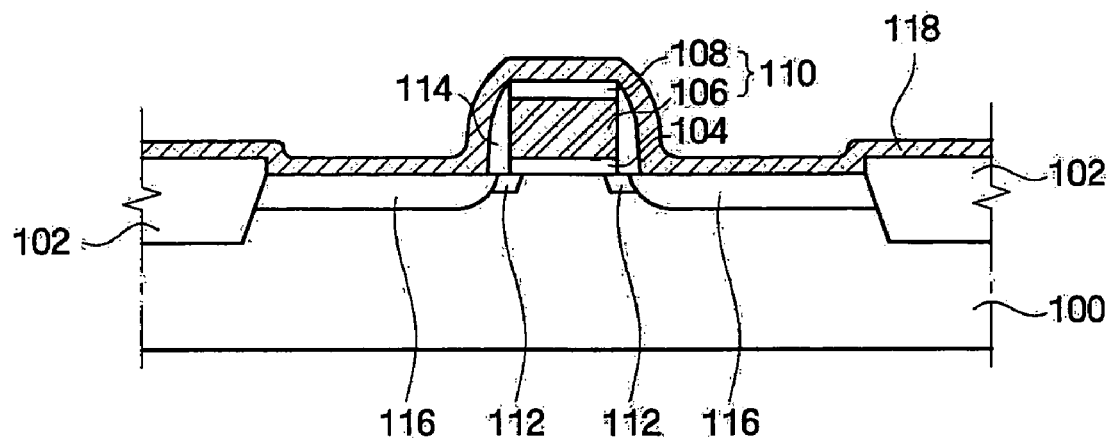

Referring to FIG. 10, after the surface of the semiconductor substrate 100 in which the source/drain regions 116 are thermally processed is washed, a metal layer 118 is formed on the entire surface of the semiconductor substrate 100. The metal layer 118 may be formed of, e.g., nickel.

Next, a capping layer is formed on the metal layer 118 (S23 of FIG. 8).

Figure 11:
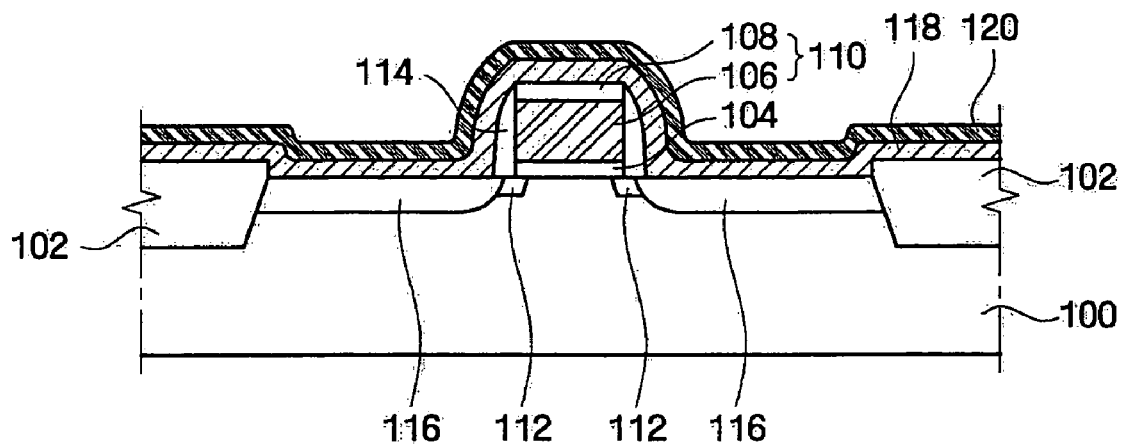

Referring to FIG. 11, a capping layer 120 is formed on the metal layer 118. The capping layer 120 is formed of, e.g., a titanium nitride (TiN) layer. The capping layer 120 is formed to prevent the metal layer 118 from being oxidized during subsequent silicidation annealing.

Next, a first thermal process and a second thermal process are performed on the metal layer 118 (S24 of FIG. 8).

Figure 12:
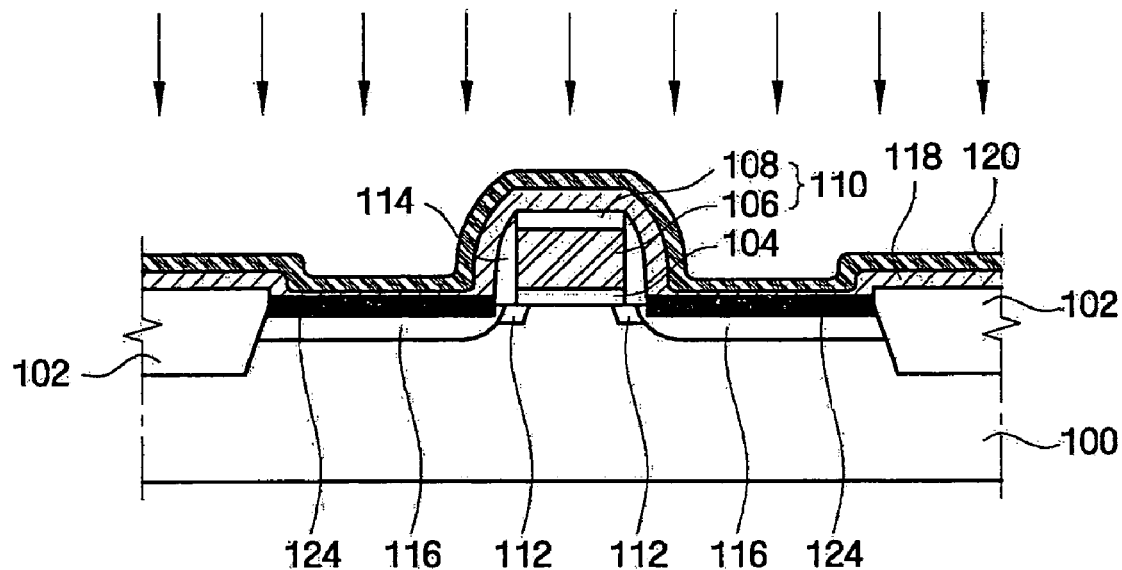

Referring to FIG. 12, after the first thermal process is performed on the metal layer 118 formed on the semiconductor substrate 100 at a temperature of 300-600° C., e.g., 300-400° C., the second thermal process is performed on the metal layer 118 at temperature that is lower than that of the first thermal process, e.g., 200-300° C., thereby forming a metal silicide layer. The second thermal process may be performed for 10 minutes, e.g., 10-30 minutes.

Next, a non-reacted portion of the metal layer 118 is removed (S25 of FIG. 8).

Figure 13:
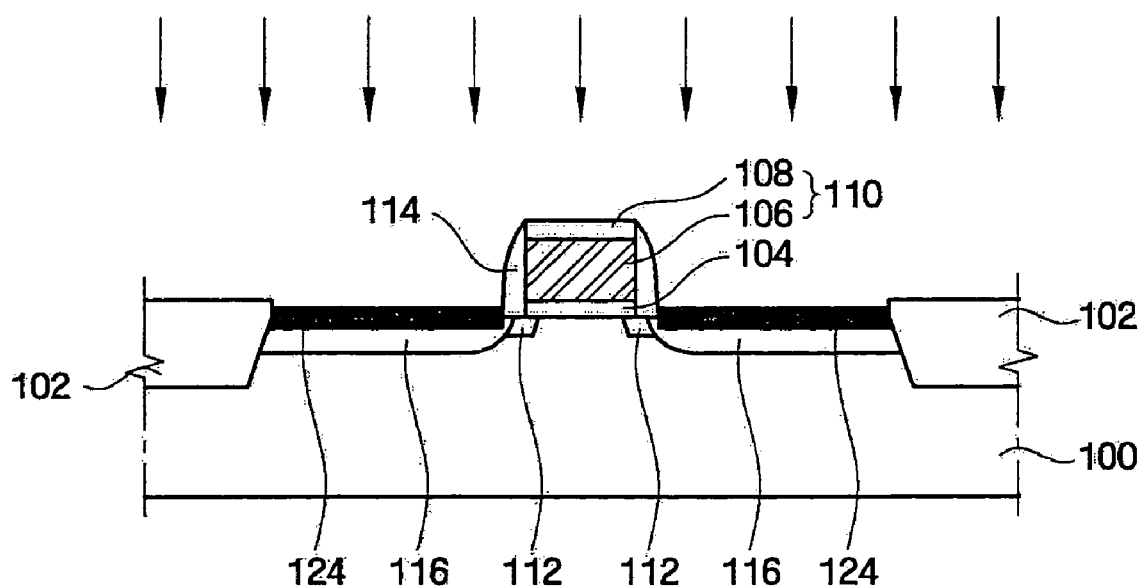

Referring to FIG. 13, the non-reacted portion of the metal layer 118 on the spacer 114, the device isolation layer 102, and the gate capping layer pattern 108 is removed. When the non-reacted portion of the metal layer 118 is removed, the capping layer 120 may also be stripped.

When the gate pattern 110 includes the gate electrode 106 and the gate capping layer pattern 108, metal silicide layers 124 are selectively formed only on the source/drain regions 116.

Next, although not shown in figures, a third thermal process is performed on the metal silicide layers 124 in the same manner as the first embodiment of the present invention (step S26 of FIG. 8), an interlayer insulating layer is formed on the entire surface of the semiconductor substrate 100 in which the metal silicide layers 124 are formed (step S27 of FIG. 8), and metal interconnection lines are formed (step S28 of FIG. 8).

Hereinafter, a method of fabricating a semiconductor device according to a third embodiment of the present invention will be described with reference to FIGS. 14 through 19. The third embodiment of the present invention is different from the first embodiment of the present invention in that a metal silicide layer is formed only on a gate electrode using a blocking pattern and a capping layer is further formed on a metal layer.

Figure 14:
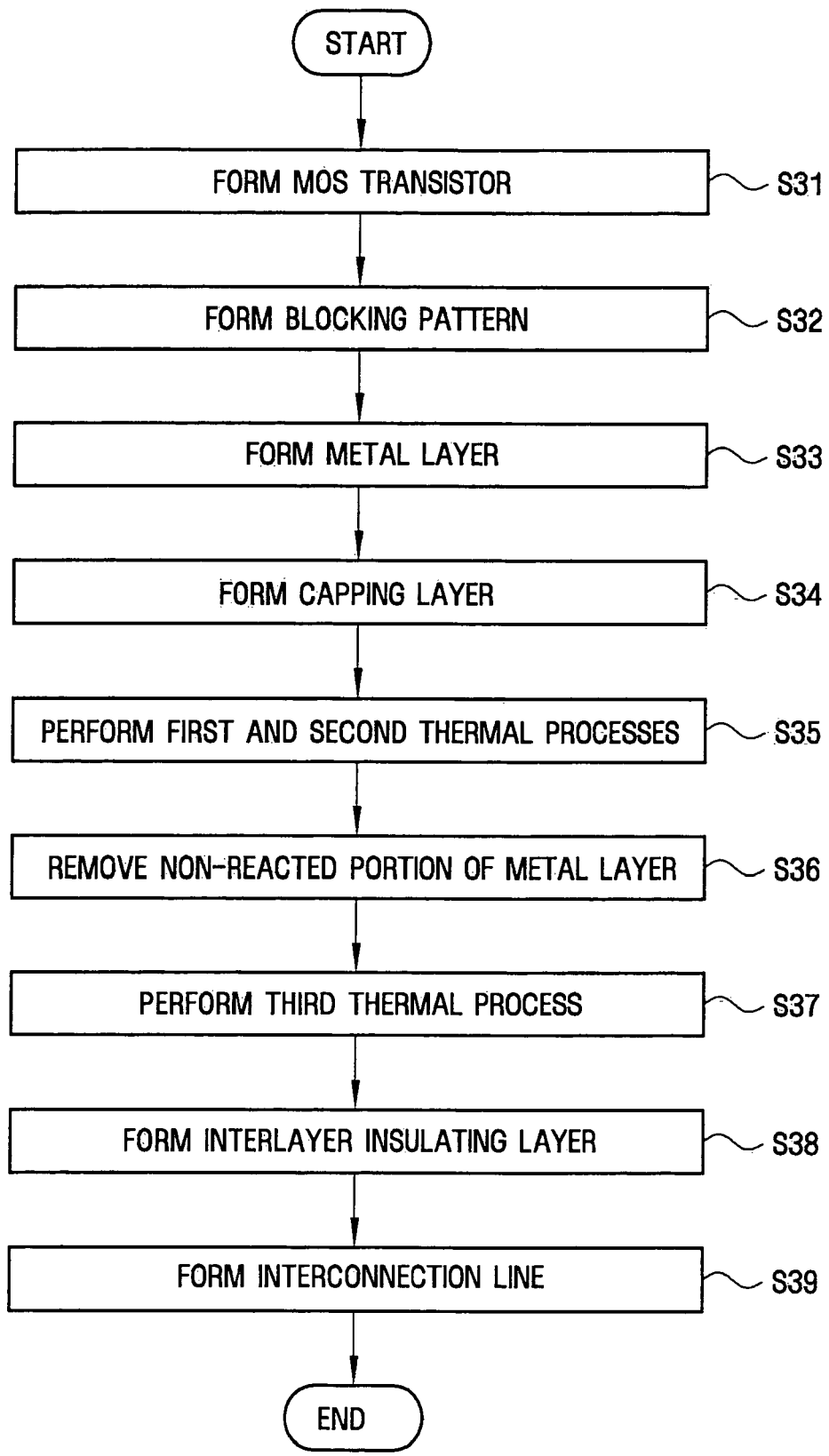
FIG. 14 i is a flowchart illustrating embodiments of a salicide process according to the invention.

FIG. 14 is a flowchart illustrating a method of fabricating a semiconductor device according to a third embodiment of the present invention. And also FIGS. 15 through 19 are cross-sectional views for explaining a method of fabricating a semiconductor device according to the third embodiment of the present invention. Although a blocking pattern that exposes the top surface of a gate pattern has been described in this description, it is only taken as an example. Thus, a blocking pattern that exposes the top surface of source/drain regions or a blocking pattern that exposes both the top surface of a source/drain pattern and the top surface of the gate electrode may be used.

Referring to FIG. 14, a MOS transistor is formed on a semiconductor substrate 110 in S21.

The MOS transistor is formed in the same manner as the first embodiment of the present invention described with reference to FIGS. 2A and 2B. In other words, an active region is defined by forming a device isolation layer 102 in the semiconductor substrate 100, and a gate insulating layer pattern 104 and a gate pattern 110 are formed on the active region. Thereafter, LDD regions 112, a spacer 114, and source/drain regions 116 are formed. In the third embodiment of the present invention, the gate pattern 110 of the MOS transistor may be formed to have only a gate electrode formed of a polysilicon layer pattern. N-type impurity ions may be doped in the polysilicon layer pattern.

Next, a mask pattern is formed on the semiconductor substrate 100 having the MOS transistor (S32 of FIG. 14).

Figure 15:
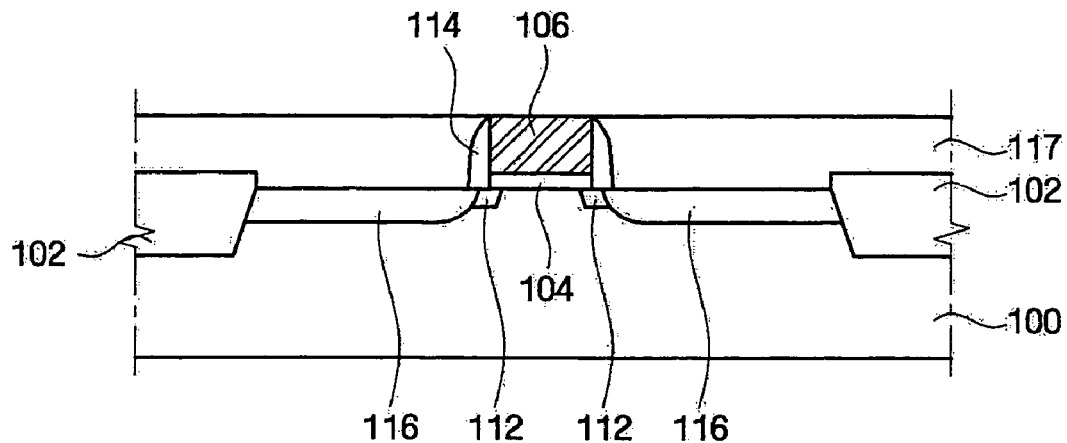
FIGS. 15 through 19 are cross-sectional views that illustrate a salicide process according to some embodiments of the invention.

Referring to FIG. 15, a blocking layer is formed on the entire surface of the semiconductor substrate 100 having the MOS transistor. The blocking layer is formed of an insulating layer having etching selectivity with respect to the gate pattern 110. For example, the blocking layer may be formed of a silicon oxide layer. The blocking layer is planarized until the gate pattern 110 is exposed, thereby forming a blocking pattern 117. As a result, the source/drain regions 116 are covered by the blocking pattern 117.

Next, a metal layer is formed on the semiconductor substrate 100 having the blocking pattern 117 (S22 of FIG. 14).

Figure 16:
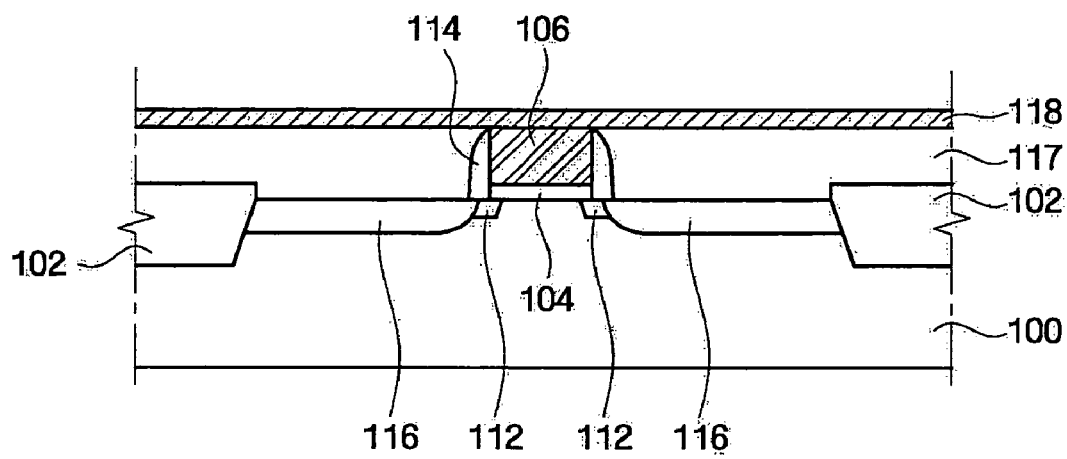

Referring to FIG. 16, the metal layer 118 is formed on the entire surface of the semiconductor substrate 100 having the exposed gate pattern 110.

Next, a capping layer is formed on the metal layer 118 (step S34 of FIG. 14).

Figure 17:
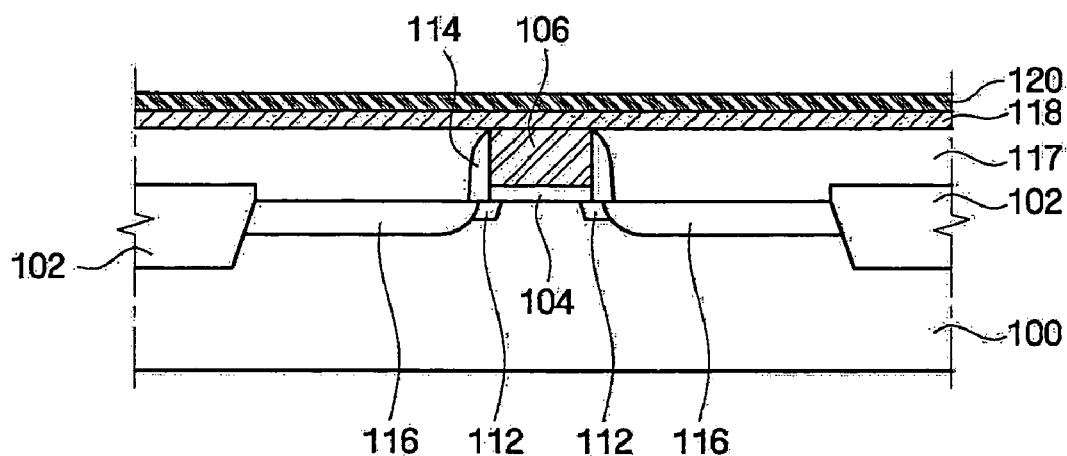

Referring to FIG. 17, a capping layer 120 is formed of a titanium nitride (TiN) layer for preventing the metal layer 118 from being oxidized during subsequent silicidation annealing.

Next, a first thermal process and a second thermal process are performed on the metal layer 118 (S35 of FIG. 14).

Figure 18:
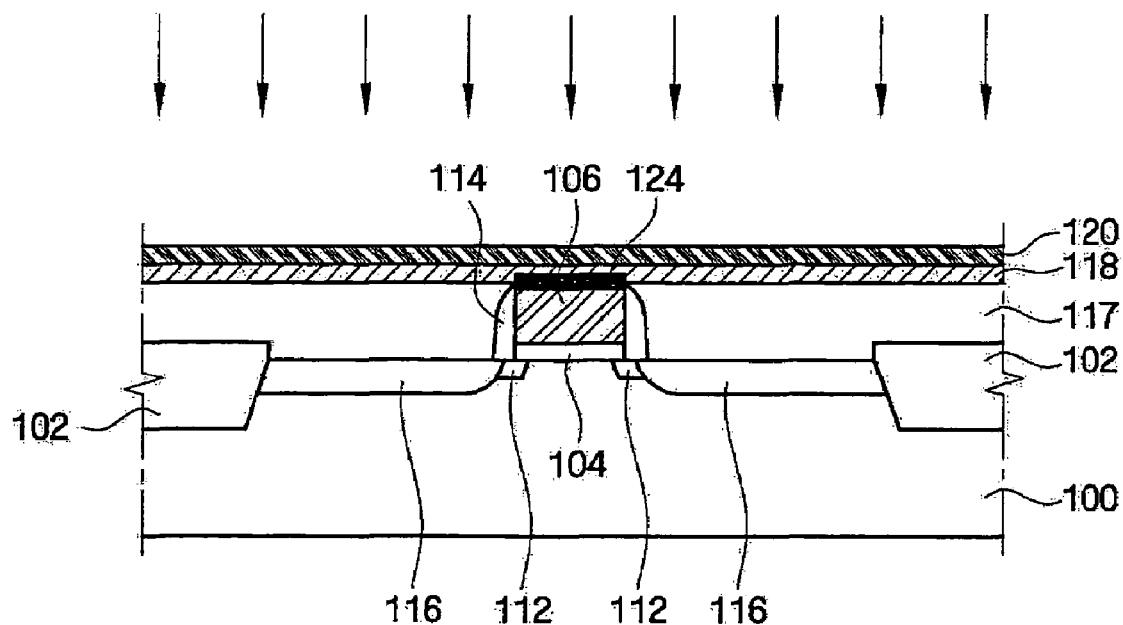

Referring to FIG. 18, silicidation annealing is performed on the metal layer 118 formed on the semiconductor substrate 100. The first thermal process and the second thermal process are performed in the same manner as the first embodiment of the present invention. As a result, metal silicide layers 124 are selectively formed only on the gate pattern 110.

Next, a non-reacted portion of the metal layer 118 is removed (S36 of FIG. 14).

Figure 19:
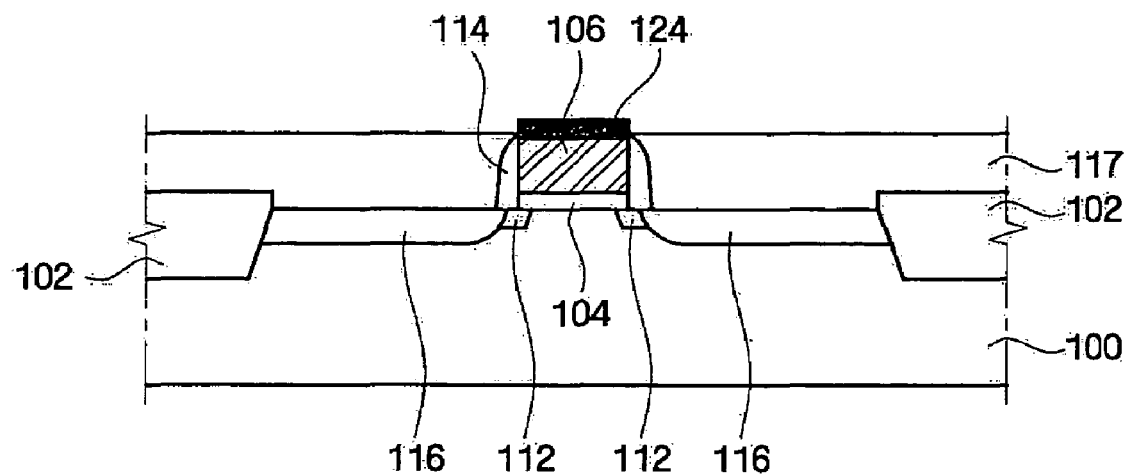

Referring to FIG. 19, the non-reacted portion of the metal layer 118 is removed. A capping layer 120 may also be stripped when the non-reacted portion of the metal layer 118 is removed.

Although not shown in figures, a third thermal process is performed on the metal silicide layers 124 in the same manner as the first embodiment of the present invention (step S37 of FIG. 14), an interlayer insulating layer is formed on the entire surface of the semiconductor substrate 100 in which the metal silicide layers 124 are formed (step S38 of FIG. 14), and metal interconnection lines are formed (step S39 of FIG. 14).

Although a nickel salicide process is particularly described in the above description, the present invention is not limited to the nickel salicide process, but may be applied to a salicide process using cobalt, titanium, or refractory metal.

EXPERIMENTAL EXAMPLES

Various measurement results of samples fabricated according to embodiments of the present invention and according to prior art are described below.

Figure 20:
FIGS. 20 and 21 illustrate electron microscope (SEM) pictures of the surface morphologies of nickel silicide layers formed in some embodiments according to the invention and according to the prior art.
Figure 21:
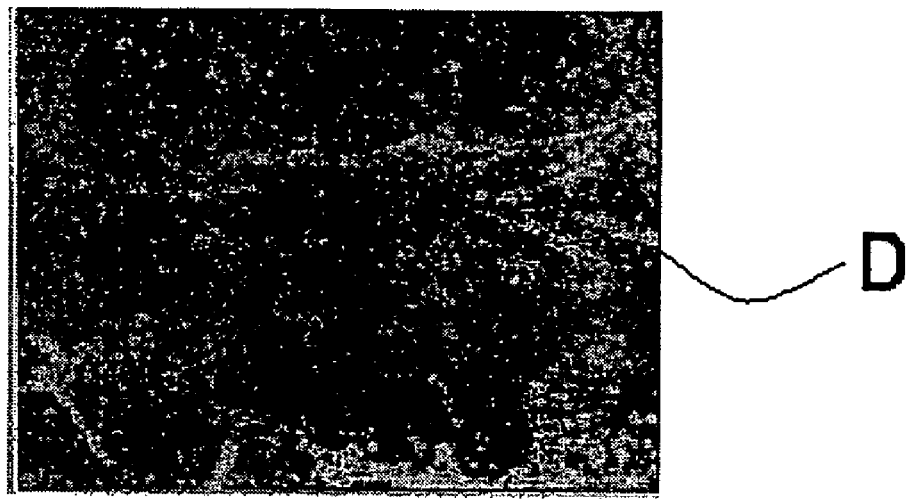

FIGS. 20 and 21 illustrate electron microscope (SEM) pictures of the surface morphologies of nickel silicide layers formed according to the present invention and according to prior art.

Nickel silicide layers providing results shown in FIGS. 20 and 21 were formed on a silicon substrate using main process conditions of Table 1.

TABLE 1

| Process condition | Present invention | Prior art |
|---|---|---|
| Metal layer | Nickel layer (100 Å) | |
| Thermal process method | *Conduction or Convection | **Hot plate |
| First thermal process | 320° C./5 min/Vacuum atmosphere | 320° C./5 min/Vacuum atmosphere |
| Second thermal process | 280° C./30 min/Vacuum atmosphere | |
| Third thermal process | 450° C./10 min/Vacuum atmosphere | 450° C./10 min/Vacuum atmosphere |

*Conduction or Convection: Thermal processing oven that can be bought in the product name of SAO-300LP from WafterMasters, Inc. in San Jose, California, U.S.
**Hot plate: ENDURA system commercialized by Applied Materials, Inc. in Santa Clara, California, U.S.

Referring to FIGS. 20 and 21, many defects (D) were generated on the surface of nickel silicide layers formed according to prior art, resulting in rough surface morphology of the nickel silicide layers. Such rough surface morphology can mean that an interface between a silicon substrate and the nickel silicide layers would not be smooth when the nickel silicide layers are applied to a MOS transistor. On the other hand, nickel silicide layers fabricated according to embodiments of the present invention have surface morphology with few (if any) defects. It can be seen from the results that surface morphology is improved by performing a first thermal process and then performing a second thermal process in an in-situ manner at temperature that is lower than that of the first thermal process.

As mentioned above, according to the invention, a metal silicide layer having fewer defects may be formed. In addition, since reliability of the metal silicide layer may be improved, stable electric characteristics of a semiconductor device using the metal silicide layer can be achieved.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed:

1. A method of forming a metal salicide layer comprising:
    forming a metal layer on a substrate;
    forming a metal silicide layer on the metal layer using a first thermal process at a first temperature; and then performing, in-situ with the first thermal process, a second thermal process on the metal layer at second temperature that is less than the first temperature.

2. A method according to claim 1 wherein the metal layer comprises a nickel layer.

3. A method according to claim 1 wherein the first temperature is about 300 to about 600° C.

4. A method according to claim 1 wherein the second temperature is about 200 to about 300° C.

5. A method according to claim 1 wherein the second thermal process is performed for about 10 minutes or more.

6. A method according to claim 5 wherein the second thermal process is performed for about 30 minutes or less.

7. A method according to claim 1 further comprising:
    removing a non-reacted portion of the metal layer remaining after the second thermal process.

8. A method according to claim 7 further comprising;
    performing a third thermal process on the metal silicide layer after removing the non-reacted portion of the metal layer.

9. A method according to claim 8 wherein the third thermal process is performed at a temperature of about 300 to about 600° C.

10. A method according to claim 1 further comprising:
    forming a capping layer on the metal layer before forming the metal silicide layer, wherein the capping layer is removed together with a non-reacted portion of the metal layer remaining after forming the metal suicide layer.

11. A method according to claim 1 wherein the substrate is doped with n-type impurity ions.

12. A method of fabricating a semiconductor device, the method comprising:
    forming a metal oxide semiconductor (MOS) transistor including source/drain regions separated from each other in a substrate, a gate pattern on a channel region in the substrate between the source/drain regions, and a spacer covering the sidewalls of the gate pattern;
    forming a metal layer on the entire surface of the MOS transistor;
    forming a metal silicide layer on the metal layer using a first thermal process at a first temperature; and then
    performing a second thermal process on the metal layer, in-situ with the first thermal process, at a second temperature that is less than the first temperature.

13. A method according to claim 12 further comprising:
    forming a suicide blocking pattern that exposes a top surface of the source/drain regions and/or the gate pattern before forming the metal layer.

14. A method according to claim 12 wherein the gate pattern includes a gate electrode and a gate capping layer.

15. A method according to claim 12 wherein the gate pattern is formed by depositing a polysilicon layer and a tungsten suicide layer or a tungsten layer on the polysilicon layer.

16. A method according to claim 12 wherein the metal layer comprises a nickel layer.

17. A method according to claim 12 wherein the first temperature is about 300 to about 600° C.

18. A method according to claim 12 wherein the second temperature is about 200 to about 300° C.

19. A method according to claim 12 wherein the second thermal process is performed for about 10 minutes or more.

20. A method according to claim 19 wherein the second thermal process is performed for about 30 minutes or less.

21. A method of fabricating a semiconductor device, the method comprising:

performing a silicidation anneal process on a nickel layer on a source/drain region at a first temperature of about 300° C. to about 400° C.; and then forming a $Ni_2Si$ layer from the nickel layer using a thermal process to react the nickel layer with silicon in the source/drain region, in-situ with the silicidation anneal process, at second temperature of about 200-300° C. for about 10 to about 30 minutes; and phase-shifting the $Ni_2Si$ layer using a thermal process at a temperature of about 400° C. to about 500° C. to form a NiSi layer.

22. A method according to claim 21 wherein each of the performing a silicidation anneal process, forming a $Ni_2Si$ layer, and phase-shifting the $Ni_2Si$ is ceased before initiating a subsequent process.

* * * * *